(12) United States Patent
Henderson et al.

(10) Patent No.: US 6,748,484 B1
(45) Date of Patent: Jun. 8, 2004

(54) MATCH RESOLUTION CIRCUIT FOR AN ASSOCIATIVE MEMORY

(75) Inventors: Alex E. Henderson, Hillsborough, CA (US); Walter E. Croft, San Mateo, CA (US); Raymond M. Chu, Saratoga, CA (US); Vishal Sarin, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 348 days.

(21) Appl. No.: 09/637,131

(22) Filed: Aug. 10, 2000

Related U.S. Application Data

(60) Provisional application No. 60/148,403, filed on Aug. 11, 1999.

(51) Int. Cl.[7] ............................................. G06F 12/00
(52) U.S. Cl. ..................... 711/108; 711/128; 711/156; 365/49
(58) Field of Search ............................. 365/49, 230.03, 365/230.06; 711/108, 128, 154, 156

(56) References Cited

U.S. PATENT DOCUMENTS

| 4,897,814 A | | 1/1990 | Clark | |
|---|---|---|---|---|
| 4,996,666 A | * | 2/1991 | Duluk, Jr. | 365/49 |
| 5,555,397 A | | 9/1996 | Sasama et al. | |
| 5,566,170 A | * | 10/1996 | Bakke et al. | 370/392 |
| 5,619,446 A | * | 4/1997 | Yoneda et al. | 365/49 |
| 5,726,942 A | * | 3/1998 | Yoneda et al. | 365/208 |
| 6,289,414 B1 | * | 9/2001 | Feldmeier et al. | 711/108 |

FOREIGN PATENT DOCUMENTS

EP     0 622 805 A1     4/1994

OTHER PUBLICATIONS

"Memory Organization Scheme for the Implementation of Routing Tables in High Performance IP Routers", IBM Technical Disclosure Bulletin, vol. 36, No. 2, Feb. 1993, pp. 151–153.

* cited by examiner

*Primary Examiner*—Donald Sparks
*Assistant Examiner*—Christian P. Chace
(74) *Attorney, Agent, or Firm*—Kerry D. Tweet

(57) ABSTRACT

A system and method for determining a best match from a plurality of matches received in response to a search input for an associative memory includes a priority field associated with each data item stored in the associative memory. The priority field corresponds to criteria that is used to order the priority of the data items in the associative memory. A match resolution circuit is coupled to receive match signals from an associative memory, such as a CAM, and the priority fields of the matching data items. The match resolution structure compares the priority fields of the matching data items to determine which data item has the highest priority. The match resolution structure indicates the data item with the highest priority in the priority field as the best match of the associative memory for the particular search input.

29 Claims, 10 Drawing Sheets

MATCH RESOLUTION CIRCUIT FOR AN ASSOCIATIVE MEMORY

RELATED APPLICATION

The subject matter of the present application is related to and claims priority, under 35 U.S.C. § 119(e), from U.S. provisional patent application serial No. 60/148,403, entitled "Match Resolution Circuit for Content Addressable Memory" by Alex E. Henderson and Walter E. Croft, which application was filed on Aug. 11, 1999 and is incorporated herein by reference.

BACKGROUND

A. Technical Field

The present invention relates generally to associative memories, and in particular to content addressable memories. More particularly, the present invention relates to an associative memory having a match resolution circuit for determining a best match from among multiple matches.

B. Background of the Invention

An associative memory, such as a content addressable memory (CAM), is a device that permits the contents of the memory to be searched and matched instead of having to specify a memory location address in order to retrieve data from the memory. A CAM may be used to accelerate any application requiring fast searching of a database, list, or pattern, such as in database machines, image or voice recognition, or computer and communication networks. A CAM provides a performance advantage over conventional memory devices with conventional memory search algorithms, such as binary or tree-based searches, by comparing the desired information against the entire list of entries simultaneously, giving an order-of-magnitude reduction in search time. For example, a binary search through a database of 1000 entries may take ten separate search steps whereas a CAM device with 1000 entries may be searched in a single operation resulting in a search which takes ten times less time. One example of an application in which CAM devices are often used is to store a routing table for high speed switching systems which need to rapidly search the routing table to look for a matching destination address so that a data packet may be routed to the appropriate destination address.

A CAM device is organized somewhat differently from typical SRAM or DRAM devices. Information stored in a CAM may be accessed by comparing the data stored in the memory with data placed in a special register known as a search input or compare register as opposed to RAM devices in which information is accessed by specifying a particular memory address. If there is a match in particular memory locations with every corresponding bit in the register, a Match Flag is asserted to let the user know that the data in the register was found in the CAM device. Thus, with a CAM device, the user supplies a piece of data she would like to match to the CAM and gets back the address of any matching pieces of data in the CAM. There are two common types of CAM memory, binary CAM and ternary CAM. Binary cam requires an exact match of all bits in the search input and comparand for a match. Ternary CAM uses a mask to allow some bits to be treated as "don't care" bits and ignored in the determination of a match.

Data in a Binary CAM location typically comprises 2 fields: a comparand and an associated data field. Unlike a random access memory ("RAM"), when a search is performed on a CAM, all comparands in a CAM are compared simultaneously with a search input stored in a register. As each comparand is compared with the search input, a match line for that comparand is activated if the comparand matches the search word. Prior art ternary CAM devices may also contain an additional field known as a mask. The mask may be used to filter off portions of the comparand during the search procedure. In other words, the mask allows a comparison between the search input and only certain portions of the comparand as determined by the mask.

A search on a CAM may result in several matches in response to the search input, however, only one result should be returned. Therefore, one problem in the prior art is determining which match from a plurality of matches should be returned as the best match for a particular search input. One solution in the prior art is to implement a priority resolution circuit that uses the position of the data item in the CAM array to determine which match to output. One disadvantage in using a priority resolution circuit based on the position of the data item in the CAM array is that it only offers one criteria, (i.e. position) for determining a best match. Additionally, in order to change the priority of a particular CAM data item, it is necessary to move the data items to different positions in the CAM array. This process is cumbersome and slows down the operation of the CAM. Accordingly it is desirable to provide a priority resolution system that is capable of determining a best match among a plurality of CAM matches. More specifically, it is advantageous to provide a priority resolution system that can be dynamically updated and can use criteria other than position to determine a best match among a plurality of matches.

SUMMARY OF THE INVENTION

The present invention overcomes the deficiencies and limitations of the prior art with a unique system and method for determining a best match from a plurality of matches resulting in response to a search input performed on an associative memory. The system and method for determining a best match from a plurality of matches comprises a priority field associated with each data item stored in the associative memory. The priority field corresponds to criteria that is used to order the priority of the data items. A match resolution module is coupled to receive match signals from an associative memory and the priority fields associated with the matching data entries. The match resolution structure compares the priority fields of the plurality of matching data items to determine which data item has the highest priority. The match resolution structure then indicates the data item having the highest priority as the best match of the associative memory for the particular search input.

These and other features and advantages of the present invention may be better understood by considering the following detailed description of preferred embodiments of the invention. In the course of this description, reference will be frequently made to the attached drawings.

DETAILED DESCRIPTION OF PREFERRED EMBODIMENTS

The present invention is particularly applicable to a content addressable memory (CAM) device, such as that used as a single or dual port CAM memory, an event-co-processor, and a database co-processor, and it is in this context that the invention will be described. It will be appreciated, however, that the match resolution module in accordance with the invention has greater utility and may be used with any type of associative memory that accesses data based upon the content of the stored data (rather than the location in which that data is stored) and provides multiple matches in response to a search input.

Figure 1:
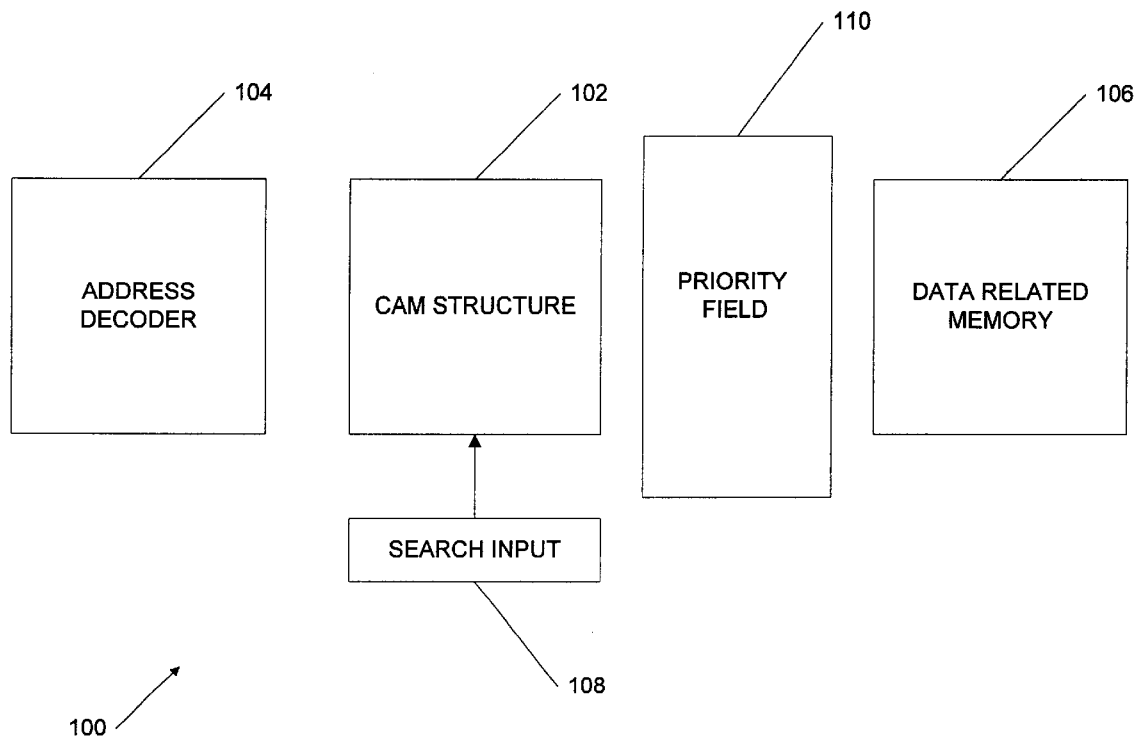
FIG. 1 is a block diagram of one embodiment of a CAM including a priority field in accordance with the present invention.

Referring now to FIG. 1, there is shown one embodiment of a CAM having a match resolution circuit in accordance with the present invention. The CAM structure comprises a CAM match structure 102 for storing CAM words or data items, an address decoder 104 for addressing the CAM when initially storing data items, and a related memory 106 which may be a random access memory (RAM) or a read-only memory (ROM). Typical CAM usage involves locating a data item in the CAM match structure 102. A data item is specified by entering a search input 108 which compares simultaneously all of the data items stored in the CAM match structure 102 with the search input 108. A typical CAM search may result in finding a plurality of data items which match the search input 108. In order to determine a "best match" for the particular search input 108, a priority field 110 associated with each data item is evaluated to determine a best match from the plurality of matches. A best match can be determined by an arithmetic or logical comparison of the priority fields 110 of all matching CAM data items. When a best match is found for a particular search input 108, the apparatus can retrieve additional information concerning the requested data item from the related memory 106. As used herein, a "best match" is used to define a single data item from a plurality of data items that match the search input 108. As one skilled in the art will readily understand, a best match does not imply that there is only one true absolute match but that in the context of the priority field 110, there is one data item which will be considered to be a best match and will be outputted by the CAM. Examples of various best matches, priority fields, and criteria are discussed in more detail below.

As discussed above, the present invention provides a priority field 110 associated with each word of the CAM. The priority field 110 allows each data item to be prioritized according to some criteria. In a preferred embodiment, a priority field 110 comprises 16 bits. One skilled in the art will realize that the number of bits comprising the priority field 110 will depend on the number of bits required to uniquely identify the priority associated with a data item. The priority field 110 may correspond to any number of criteria, including but not limited to, a weight field stored in the CAM match structure 102, length of the longest contiguous unmasked field in the CAM match structure 102, the total number of unmasked bits in the CAM match structure 102, the total number of matching bits resulting from a compare, the path length metric derived from a routing protocol such as OSPF, the order of an order dependent list such as an Access Control List for a router, a prefix length of an IP address, or position in the CAM match structure. Thus, the present invention advantageously allows the use of a variety of criteria for ordering the priority of each data item.

Additionally, because the priority field is a separate field for indicating the priority of the data item, the priority of the various data items may be changed by changing the entry in the priority field. For example, assume a CAM structure contains a first data item A, a second data item B, and a third data item C. Further assume that the first data item A has a priority field indicating that it has a priority of 1, the second data item B has a priority field indicating that it has a priority of 2, and the third data item C has a priority field indicating that it has a priority of 3. If priority is determined according to the priority field with the highest number, then the third data item C, which has a priority of 3, has the highest priority. However, if for some reason it is necessary to change the priority of the data items, the priority of a data item may be changed simply by changing the priority field. For example, assume that the priority field for the first data item A is changed from 1 to 3 and the priority field for the third data item C is changed from 3 to 1, then using the same convention that priority is determined according to the highest number, the first data item A, which now has a new priority of 3, has the highest priority. Thus, the present invention advantageously provides a simple mechanism for changing the priority of data items by changing the priority in the priority field.

The present invention also provides for hierarchical match resolution. In other words, if two or more CAM data items have the same priority according to one priority field criteria, then a second priority field criteria can be applied to these entries to determine a best match. A preferred embodiment for a hierarchical match resolution system for a CAM is described below in more detail with reference to FIG. 6.

Figure 2:
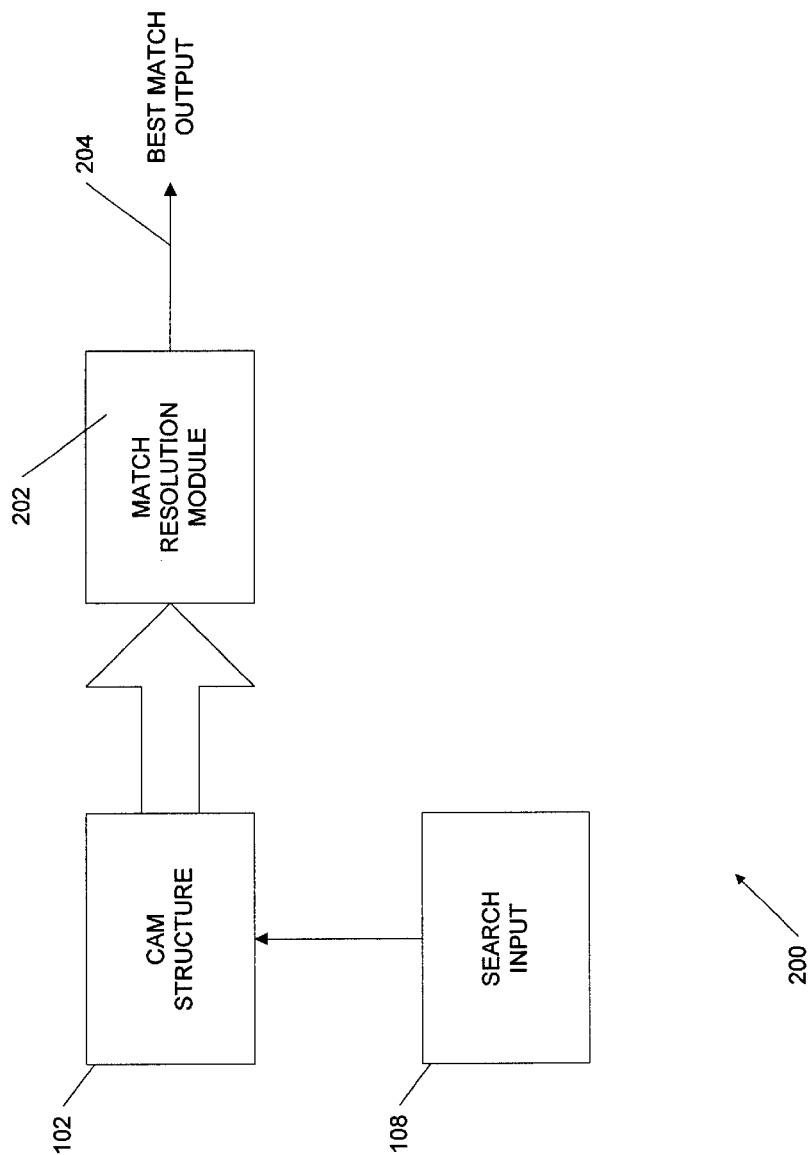
FIG. 2 is a block diagram of one embodiment of a CAM including a match resolution circuit.
Figure 3:
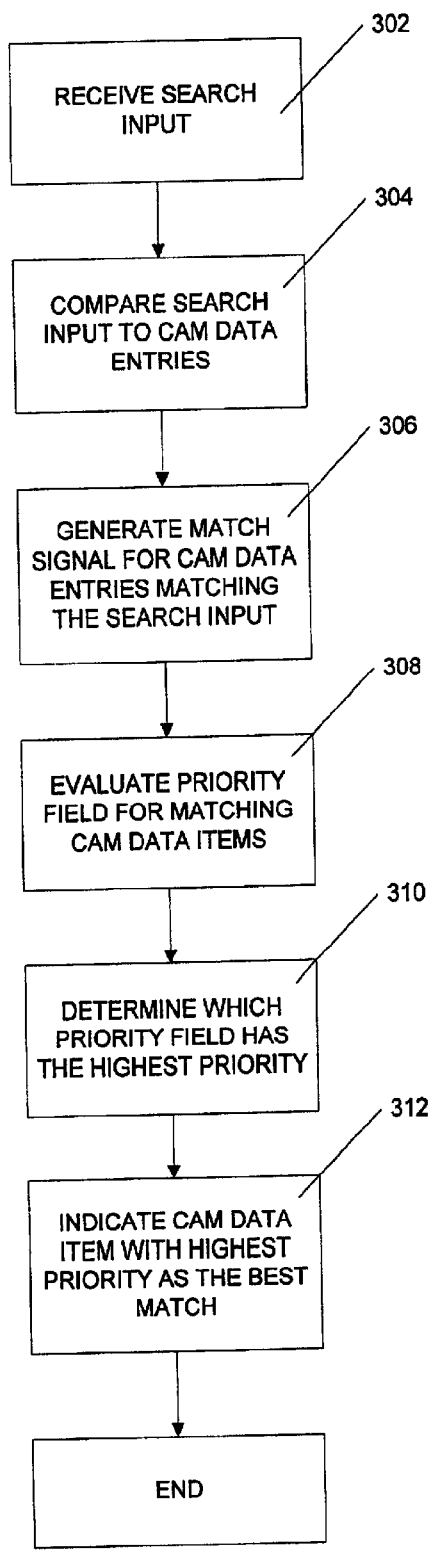
FIG. 3 is a block diagram of one embodiment of a method for determining a best match.

Referring now to FIG. 2 and FIG. 3, there are shown a functional block diagram of one embodiment of a CAM including a match resolution circuit and a block diagram of one embodiment of a method for determining a best match from a plurality of matches. The CAM structure 200 comprises a CAM structure 102 coupled to receive a search input 108. The CAM structure 102 receives (302) the search input 108 and compares (304) the search input 108 to all the data item entries in the CAM structure 102 as described above. The CAM structure 102 then generates (306) a match signal (not shown) for all CAM data items in the CAM that match the search input 108. The CAM structure 102 then outputs the match signal and the priority field (not shown) to the match resolution circuit 202. The match resolution circuit 202 evaluates (308) the priority field for each matching CAM data item and determines (310) which priority field has the highest priority. The output of the match resolution circuit 202 then indicates (312) the CAM data item with the highest priority according to the priority field. The indicated item is considered the best match for the particular search input 108. Preferably, the output of the match resolution circuit 204 comprises either prioritized match signals or the address of the highest priority matching entry.

Figure 4:
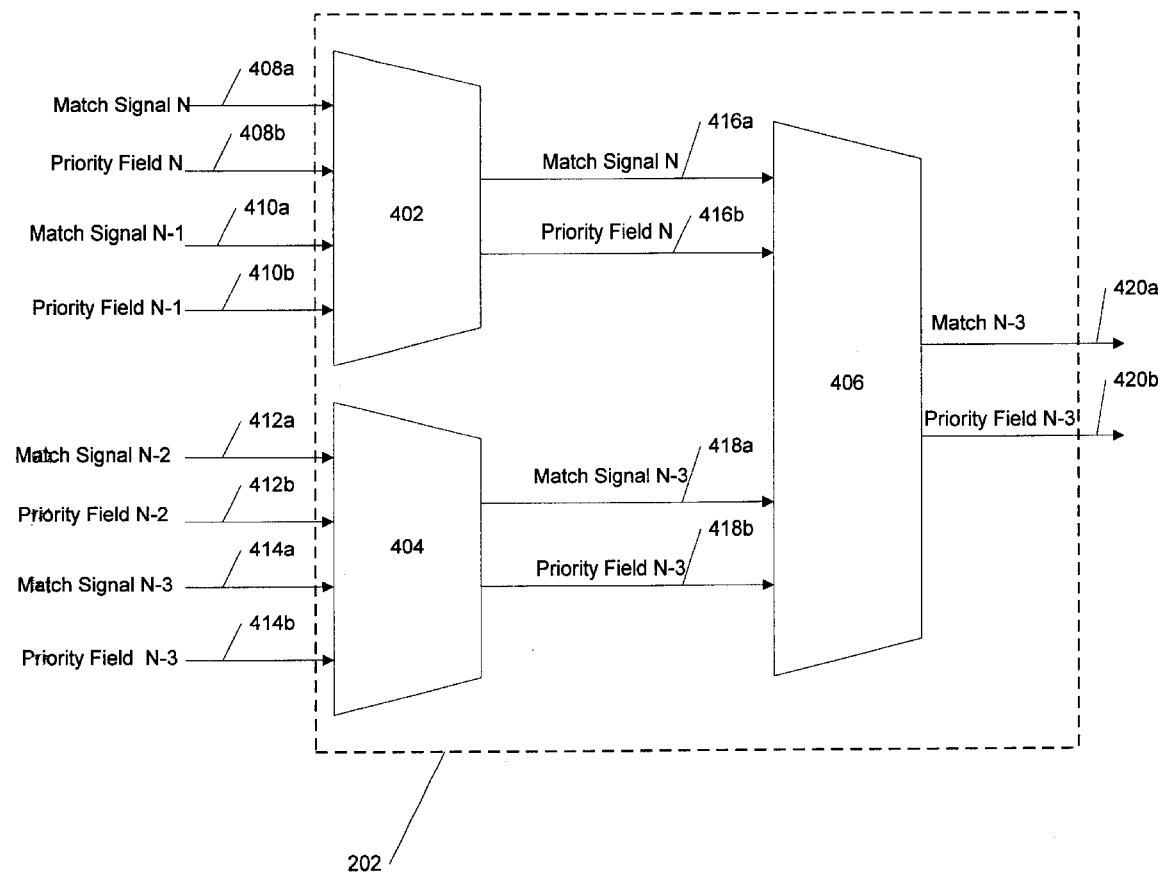
FIG. 4 is a block diagram illustrating one embodiment of a match resolution circuit for a CAM.

Referring now to FIG. 4, there is shown a block diagram illustrating one embodiment of a CAM match resolution circuit. A CAM match resolution circuit in accordance with the present invention comprises a first two port priority resolution circuit 402, a second two port priority resolution circuit 404, and a third two port priority resolution circuit 406. The first and second two port priority resolution circuits, 402 and 404, are each coupled to receive a match signal and a priority field associated with two CAM data items. For example, the first two port priority resolution circuit 402 is coupled to receive a first match signal 408*a* and a first priority field signal 408*b* from one CAM data item, and a second match signal 410*a* and a second priority field signal 408*b* from a second CAM data time. The first two port priority resolution circuit 402 determines which CAM data item has the higher priority according to the inputted match and priority field signals and outputs the match signal 416*a* and the priority field signal 416*b* with the highest priority. Similarly, the second two port priority resolution circuit 404 is coupled to receive a first match signal 412*a* and a first priority field signal 412*b* from one CAM data item, and a second match signal 414*a* and a second priority field signal 414*b* from a second CAM data item. The second two port priority resolution circuit 404 determines which CAM data item has the higher priority according to the inputted match and priority field signals and outputs the match signal 418*a* and the priority field signal 418*b* with the highest priority. The third two port priority resolution circuit 406 then compares the results from two port priority resolution circuit 402 and two port priority resolution circuit 404 and outputs the match signal 420*a* and the priority field signal 420*b* with the highest priority. For example, if the priority field signal corresponds to an assigned priority number, then the CAM data item with the highest priority number would be outputted from two port priority resolution circuit 406. One skilled in the art will recognize that the present invention is not limited to only determining the "highest priority" but that the principles of the present invention can also be used to determine and output the data item with the "lowest" priority. Thus, a CAM match resolution circuit can be implemented as a stack of two entry match resolution circuits wherein each two entry match resolution circuit compares two input values and outputs the greater value. The present invention is not limited to the use of three two port priority resolution circuit in a two stage circuit for determining a best match, but one skilled in the art will realize that the principles of the present invention may be applied to any number of two port priority resolution circuit arranged in the necessary number of tages for comparing the priority fields of any number of data items.

Figure 5:
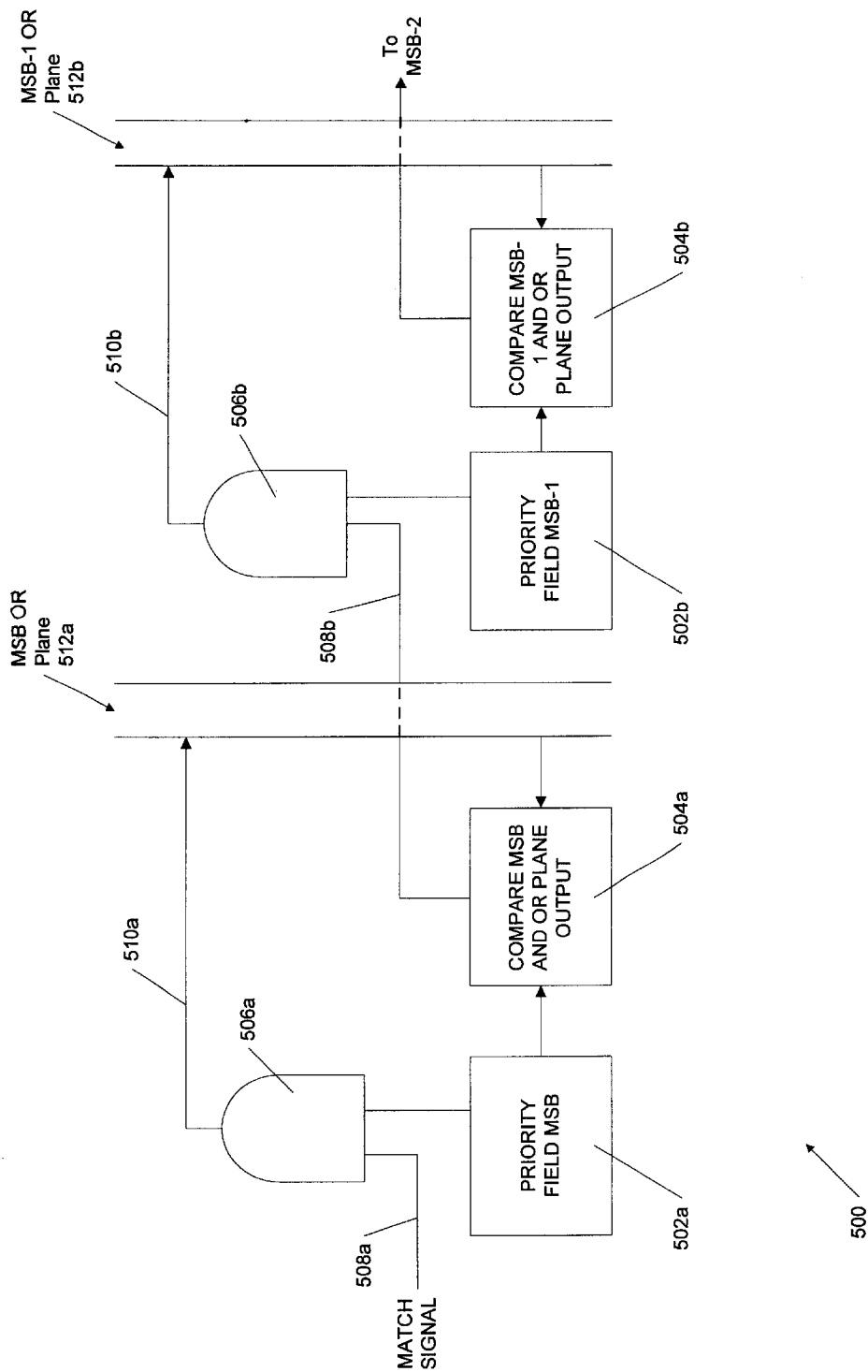
FIG. 5 is a block diagram of another embodiment of a match resolution circuit for a CAM.

Referring now to FIG. 5, there is shown a block diagram of one embodiment of one row of a match resolution circuit for a CAM. The match resolution circuit 500 comprises a priority field Most Significant Bit (MSB) component 502, a compare MSB and OR plane output component 504, a match signal 508, an AND gate 506, and a MSB OR plane 512. As indicated in FIG. 5, the match resolution circuit of the present invention incorporates each of these elements for each bit in the priority field. In other words, the bits in the priority field for a data item are evaluated serially. FIG. 5 illustrates these elements for only two bits of the priority field in the interest of simplicity. In a preferred embodiment, the match signal 508 is the high order bit of the priority field. For the first bit in the priority field, the match signal 508*a* and the priority field MSB are ANDed together and outputted to the MSB OR plane 512*a*. The result of the MSB OR plane 512*a* is compared with the MSB of the priority field received from the priority field MSB 502*a*. The result is then used as compare ok or enable signal for the next AND gate 506*b* for the next comparison. This process is repeated until a determination of the best match is made. Thus, the most significant bit of all priority fields are compared to the result of the OR plane. If the priority field bit matches the result a compare OK signal is propagated to the next less significant bit. The OR function can also be implemented using precharge logic as shown in FIG. 6*b*.

Figure 6A:
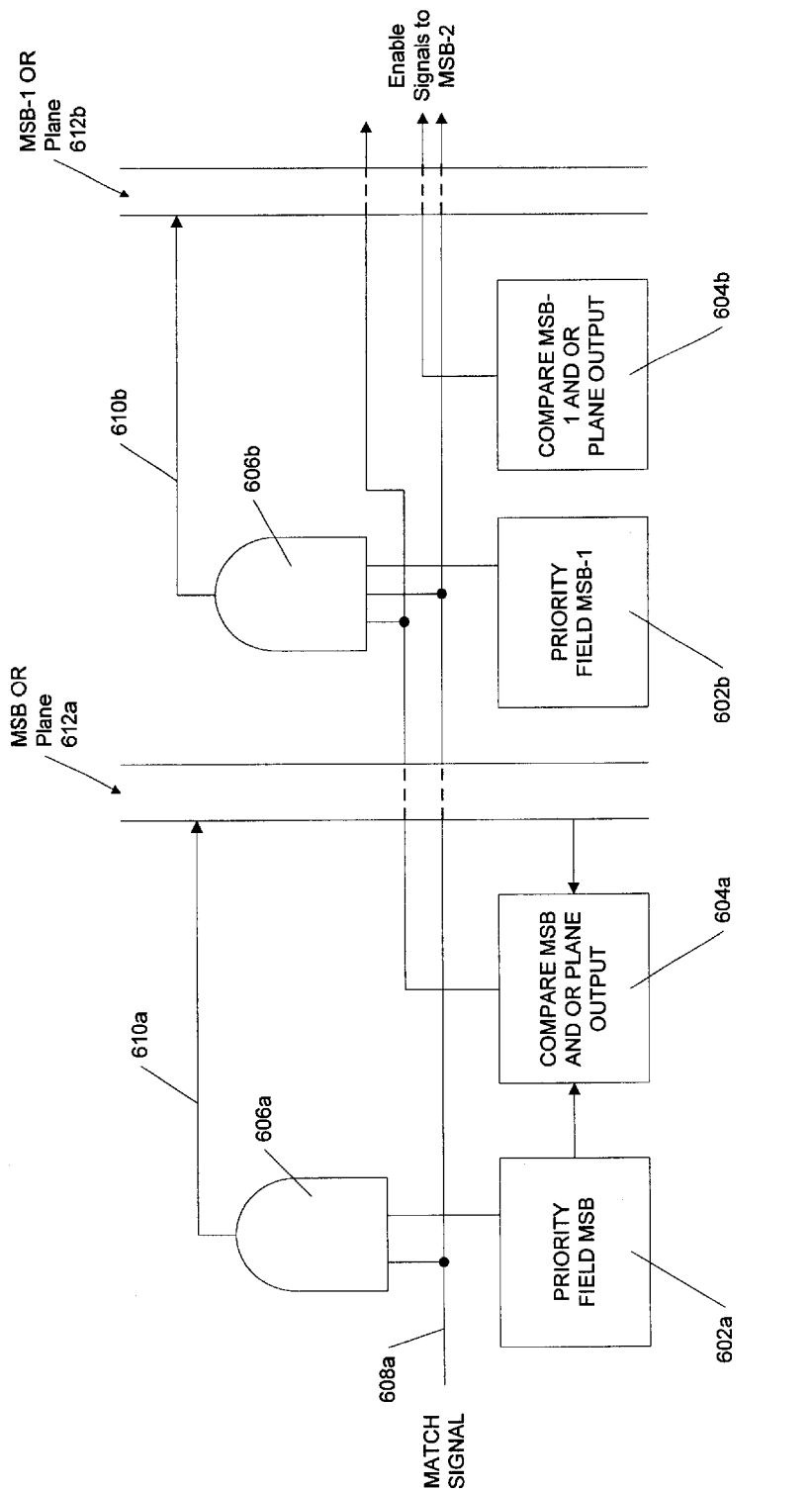
FIGS. 6a–6d are block diagrams of other embodiments of a match resolution circuit for a CAM.

Referring now to FIG. 6*a*, there is shown another embodiment of a match resolution circuit for a CAM in accordance with the present invention. The embodiment described in detail in FIG. 5 can be implemented using a "look ahead" logic similar to an adder circuit. The addition of a "look ahead" logic advantageously improves the speed of the match resolution circuit. In another embodiment, the MSB OR plane 512 can be implemented using wide gate structures as described in U.S. Pat. No. 5,999,435, entitled "Content Addressable Memory Device," by Alex E. Henderson and Walter E. Croft, which patent is incorporated herein by reference in its entirety.

Figure 6B:
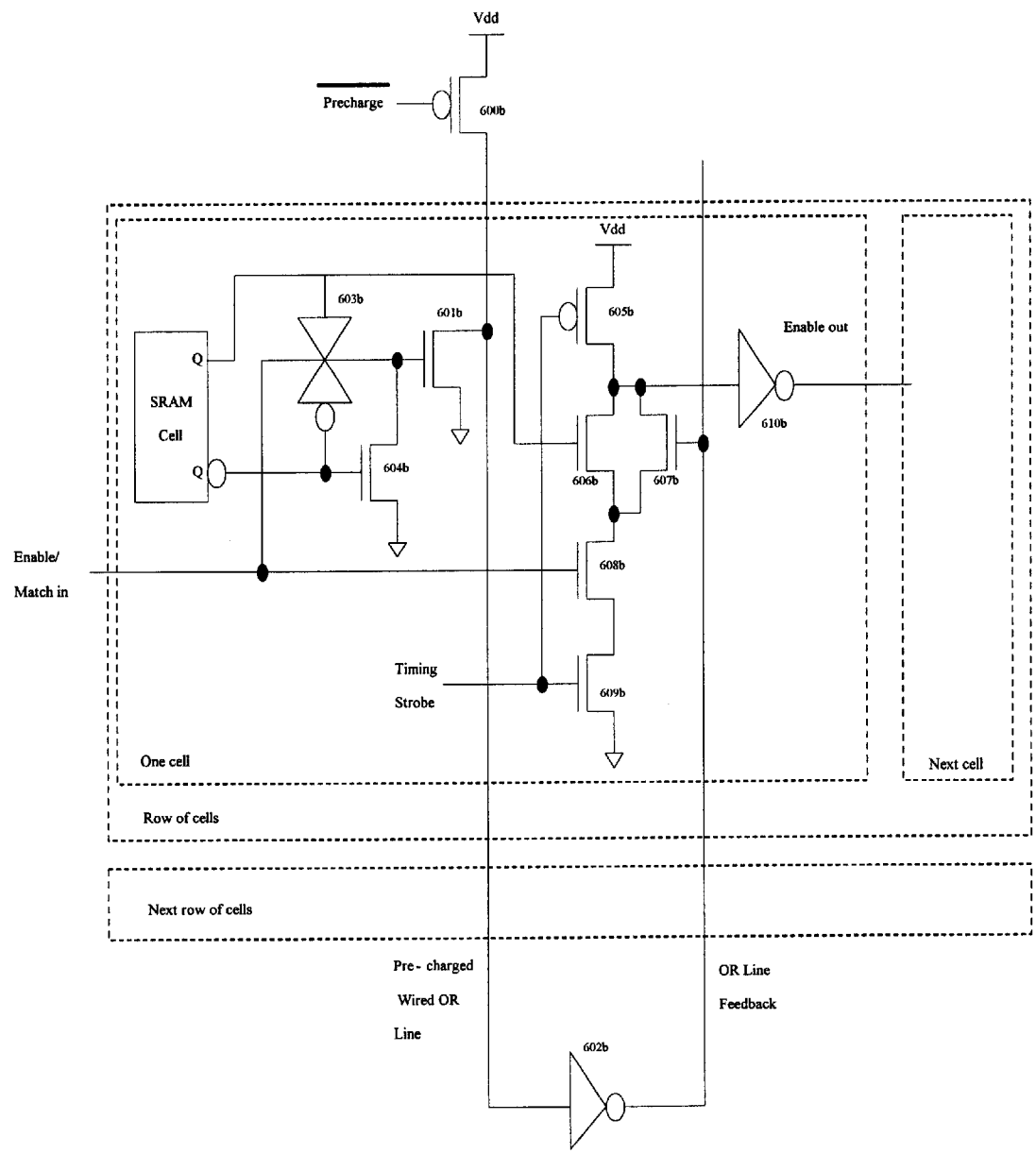

FIG. 6*b* is a precharge logic implementation of the circuit of FIG. 6*a*. The OR function is implemented by pre-charge transistor 600*b*, pulldown transistor 601*b* (one per cell) and inverter 602*b*. Transfer gate 603*b* and transistor 604*b* implement the AND function. The compare function is implemented by the pre-charge logic complex gate comprising transistors 605*b* through 609*b* and inverter 610*b*. Transistors 605*b* and 609*b* are controlled by a timing signal generated by a dummy row or other timing method. The timing strobe is required to prevent a false enable out from corrupting the result of the next cell. The timing circuits are designed so that the timing strobe occurs after the OR feedback line is stable.

Figure 6C:
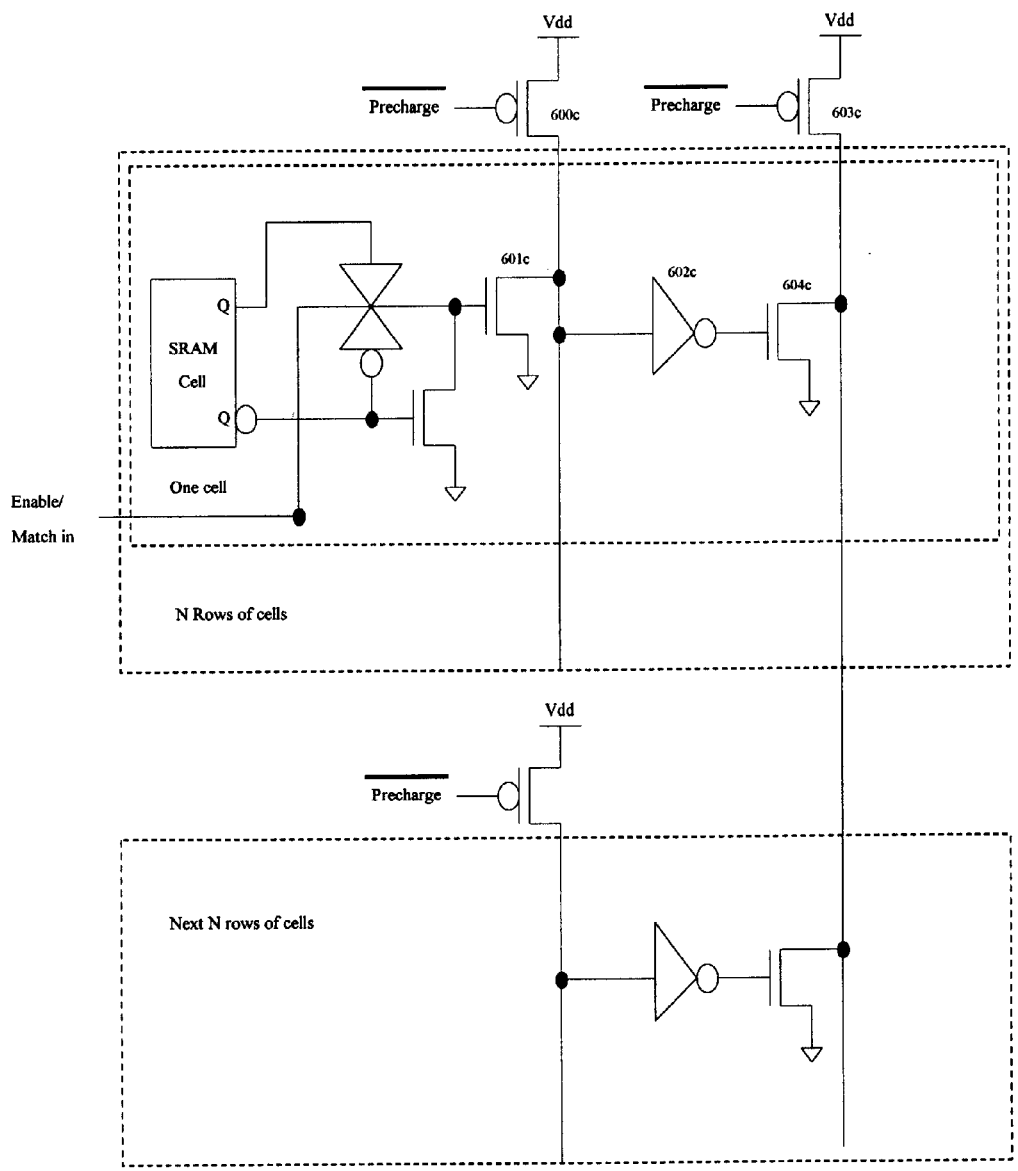

FIG. 6*c* is a faster version of the circuit of FIG. 6*b*. The pre-charge logic OR has been divided into multiple sub-circuits comprising N rows (transistors 600*c*, 601*c* and inverter 602*c*). The results of the sub-circuits are combined by a second OR circuit comprising transistors 603*c* and 604*c*. This reduces the loading on the first layer OR resulting in increased speed and combines the feedback and second level OR function.

Figure 6D:
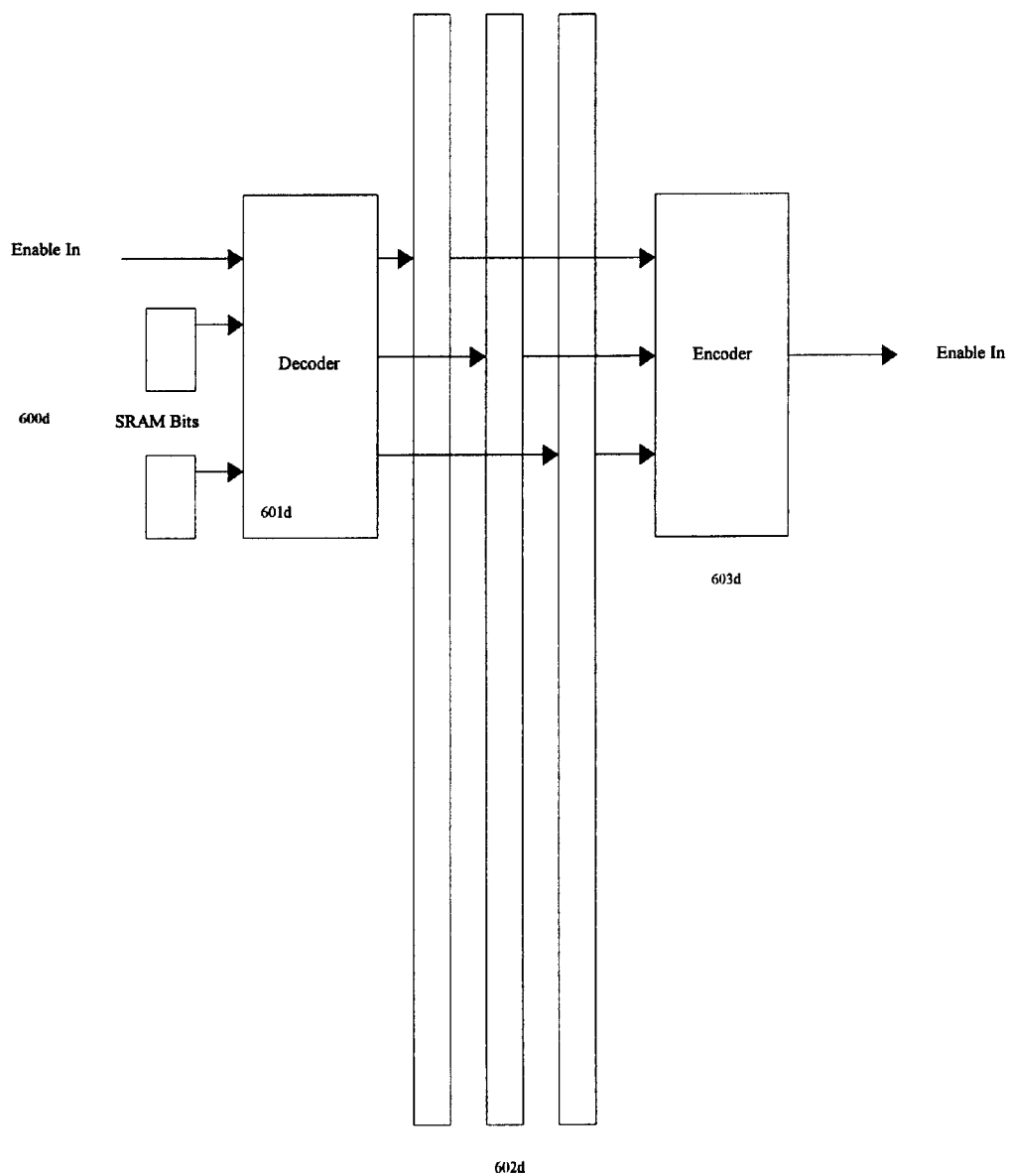

FIG. 6*d* is a diagram of a match resolution circuit that implements a multi-bit priority resolution to further increase speed. Multiple priority bits are decoded and used to drive multiple OR planes. The results of the OR functions are encoded to generate an enable output. The pre-charge implementations of the OR functions described in 6*b* and 6*c* can be used to implement the OR planes. For a two bit priority resolution circuit the decodes x1, 1x and 11 can be used as inputs to the OR planes.

Figure 7:
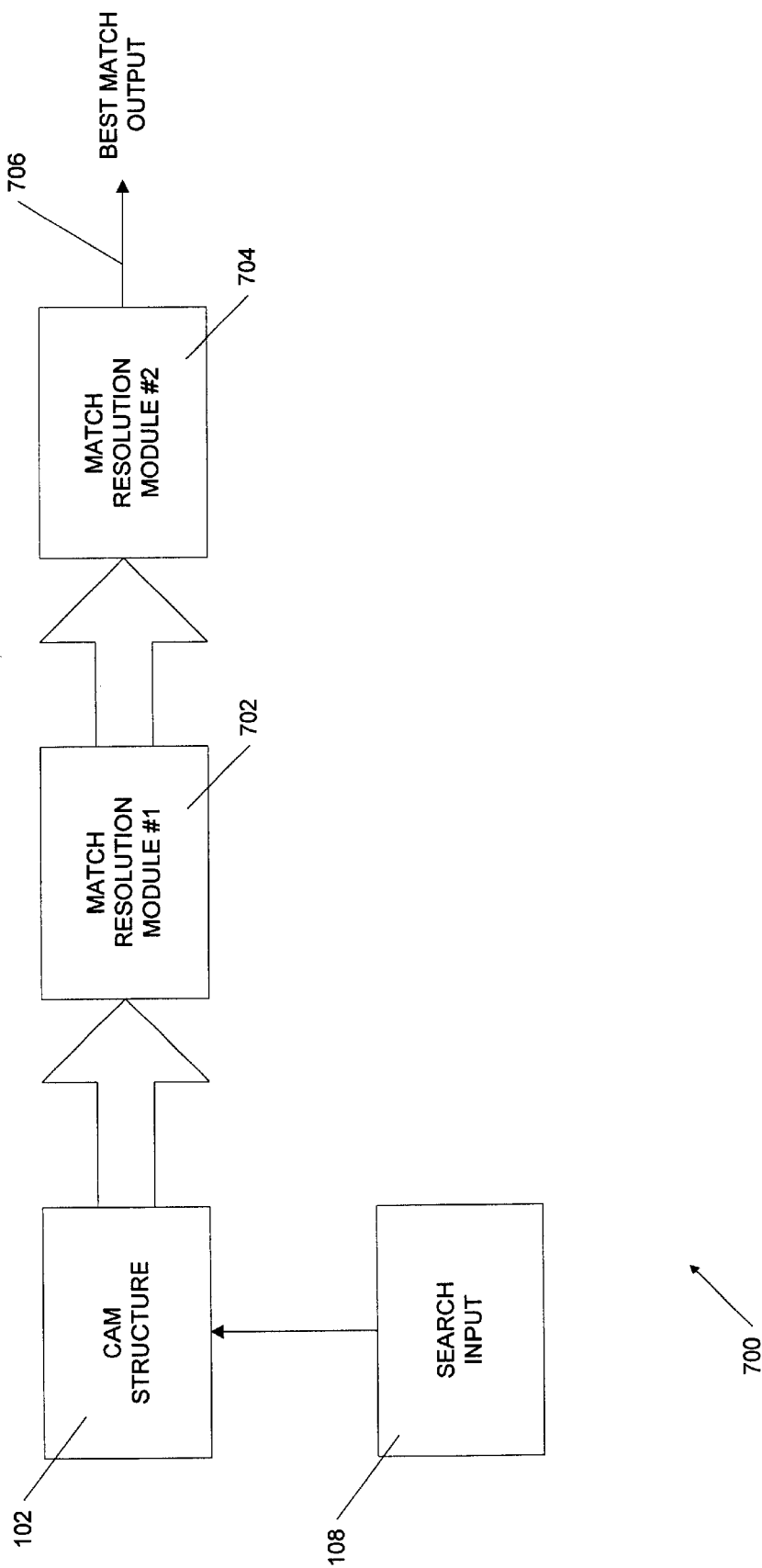
FIG. 7 is one embodiment of a hierarchical match resolution circuit for a CAM.

Referring now to FIG. 7, there is shown one embodiment of hierarchical match resolution circuit for a CAM. The hierarchical match resolution circuit for CAM cascades two or more match resolution circuits, 702 and 704, such that if there are multiple "best" matches based on a first criteria (e.g. network path length), a second criteria (e.g. link speed) can be used to determine the best match. A hierarchical match resolution circuit for a CAM comprises a CAM structure 102 coupled to receive an input search 108, a first match resolution module 702, and a second match resolution module 704. As described above, the CAM structure 102 receives a search input 108 and compares the search input 108 to all the CAM data items. The CAM structure 102 then generates a match signal for each data item which matches the search input 108. The search result of the CAM may result in a plurality of data items which match the search input 108. In such instances, a first match resolution circuit 702 is coupled to receive the match signals and the first priority fields associated with each CAM data item that matched the search input 108. The first match resolution circuit 702 evaluates the first priority field of each of the matching items and determines which data item has the highest priority based on the first priority fields. The first match resolution circuit 702 may result in multiple data items having equal priority based on the first priority field (e.g. when network path length is used). The second priority fields are then evaluated to determine a best match best on the second priority field with the highest priority. The data item with the second priority field with the highest priority is then outputted as the best match. One skilled in the art will recognize that the present invention is not limited to two match resolution circuits but that any number of match resolution circuits may be implemented to determine a best match using several criteria. Additionally, for each additional criteria used for determining priority, an additional priority field is associated with each data item. Thus, if two criteria are used for determining priority in a hierarchical match resolution circuit, then preferably each data item includes a first priority field and a second priority field. Similarly, if three criteria are used for determining priority in a hierarchical match resolution circuit, then preferably each data item includes a first priority field, a second priority field, and a third priority field. Thus, the present invention advantageously allows more than one criteria to be used to determine a best match from a plurality of matches resulting from a CAM search.

From the above description, it will be apparent that the invention disclosed herein provides a novel and advantageous system and method for determining a best match from a plurality of matches determined in response to a search item. The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A match resolution structure for selecting a best match from a plurality of matches, the plurality of matches determined in response to a search input for an associative memory, the structure comprising:
    a plurality of match inputs, each match input receiving a priority field contains one of multiple criteria for indicating a priority of the match input; and
    a match resolution logic, coupled to receive the priority field from at least two match inputs, for comparing the priority fields and indicating a best match.

2. The structure of claim 1 wherein the criteria includes a length of the longest contiguous unmasked field in a data item.

3. The structure of claim 1 wherein the criteria includes a total number of unmasked bits in a data entry.

4. The structure of claim 1 wherein the criteria includes a prefix length of an IP address.

5. The structure of claim 1 wherein the criteria includes a path length metric derived from a routing protocol.

6. The structure of claim 1 wherein the criteria includes an order of an order dependent list.

7. The structure of claim 1 wherein the priority field for a data item may be changed to indicate a change in priority for that data item.

8. The structure of claim 1 wherein the match resolution logic comprises a stack of two port priority resolution circuits.

9. The structure of claim 1 further comprising a second priority field associated with each data item.

10. The structure of claim 1 wherein the associative memory is a CAM.

11. A method of operation for a match resolution circuit, the match resolution circuit being coupled to receive a plurality of data items from an associative memory, each data item having an associated priority field, the method comprising:
    receiving a plurality of match signals for the plurality of data items; and
    comparing the priority field, containing one of multiple criteria, and the match signals for the data items to determine a best match.

12. The method of claim 11 wherein the priority field contains the length of the longest contiguous unmasked field in the data item.

13. The method of claim 11 wherein the priority field contains the total number of unmasked bits in the data entry.

14. The method of claim 11 wherein the priority field contains the position of data item.

15. The method of claim 11 wherein the data item further includes a second priority field, the method further comprising the step of:
    comparing the second priority field associated with the data items for determining a best match.

16. The method of claim 11 wherein the associative memory is a CAM.

17. An associative memory structure for storing and prioritizing a plurality of data items in the associative memory, the structure comprising:
    a match structure for storing a plurality of data items, each data item having a priority field, containing one of multiple criteria, for prioritizing the plurality of data items; and
    a search input, for receiving a search item that is compared simultaneously with the plurality of data items.

18. The structure of claim 17 wherein the first priority field contains the length of the longest contiguous unmasked field in the data item.

19. The structure of claim 17 wherein the associative memory is a CAM.

20. A method for selecting a best matching data item from a plurality of matching data items determined in response to a search input, each matching data item having a priority field, the method comprising:
    receiving the priority field, containing one of multiple criteria, for each matching data item;
    evaluating the priority field for each matching data item; and
    selecting a best matching data item by selecting the priority field with the highest priority.

21. The method of claim 20 wherein each matching the priority field contains the length of the longest contiguous unmasked field in the data item.

22. The method of claim 20 wherein the priority field contains the total number of unmasked bits in the data entry.

23. The method of claim 20 further comprising the step of:
    altering the priority of at least one data item by changing the priority field of at least one data item.

24. A match resolution circuit for selecting a best matching data item from at least a first data item and a second data item, the at least first data item and second data item matching a search input for an associative memory, the first data item including a first priority field and the second data item including a first priority field, the circuit comprising:
    a first input for receiving the first priority field, containing one of multiple criteria, of the first data item;

a second input for receiving the first priority field, containing one of multiple criteria, of the second data item; and a compare circuit for comparing the first priority field of the first data item and the first priority field of the second data item and for indicating the first priority field with the highest priority.

25. The circuit of claim 24 wherein the first and second priority field contain the length of the longest contiguous unmasked field in the data item.

26. The circuit of claim 24 wherein the first and second priority field contain the total number of unmasked bits in the data item.

27. The circuit of claim 24 wherein the associative memory is a CAM.

28. The circuit of claim 24 wherein the first data item and the second data item each further include a second priority field, the circuit further comprising:

a third input for receiving the second priority field of the first data item;

a fourth input for receiving the second priority field of the second data item; and a second compare circuit for comparing the second priority field of the first data item and the second priority field of the second data item and for indicating the second priority field with the highest priority.

29. A match resolution circuit for indicating a best match from a plurality of matches received from an associative memory, the circuit comprising:

a plurality of inputs for receiving a priority field, containing one of multiple criteria, associated with the plurality of matches; and a compare circuit, coupled to receive the plurality of inputs, for evaluating the priority fields associated with the plurality of matches, and indicating a best match from among the plurality of matches.

* * * * *